(12) United States Patent
Lin et al.

(10) Patent No.: US 11,703,537 B2
(45) Date of Patent: Jul. 18, 2023

(54) METHOD AND APPARATUS FOR ANALYSIS OF INTERFACE STATE OF MIS-HEMT DEVICE

(71) Applicant: PEKING UNIVERSITY SHENZHEN GRADUATE SCHOOL, Guangdong (CN)

(72) Inventors: Xinnan Lin, Guangdong (CN); Shuhao Xiong, Guangdong (CN)

(73) Assignee: PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 310 days.

(21) Appl. No.: 17/293,910

(22) PCT Filed: Apr. 2, 2020

(86) PCT No.: PCT/CN2020/083057
§ 371 (c)(1),
(2) Date: May 13, 2021

(87) PCT Pub. No.: WO2021/077684
PCT Pub. Date: Apr. 29, 2021

(65) Prior Publication Data
US 2022/0018888 A1   Jan. 20, 2022

(51) Int. Cl.
*G01R 31/26*   (2020.01)
*G01R 27/26*   (2006.01)
*H01L 29/778*  (2006.01)

(52) U.S. Cl.
CPC ..... *G01R 31/2621* (2013.01); *G01R 27/2605* (2013.01); *H01L 29/7786* (2013.01)

(58) Field of Classification Search
CPC ............ G01R 31/2621; G01R 27/2605; H01L 29/7786; H01L 29/2003; H01L 29/41766
See application file for complete search history.

(56) References Cited

FOREIGN PATENT DOCUMENTS

| CN | 105870011 A | * | 8/2016 | ............. G06F 17/50 |
| CN | 109901038 B | * | 6/2021 | |

* cited by examiner

*Primary Examiner* — Amy He

(57) ABSTRACT

Disclosed are method and an apparatus for analysis of an interface state of a MIS-HEMT device. By means of establishing an equivalent model of MIS-HEMT(s) that includes equivalent circuits representing a dielectric layer, a barrier layer and a channel layer, plotting a group of a capacitance-frequency function curve and a conductance-frequency function curve that can be best fitted to the measured capacitance-frequency scatter diagram and the measured conductance-frequency scatter diagram via the equivalent model, taking such best-fitted group as the fitted function curve group, and calculating parameters about the interface state of MIS-HEMT(s) according to the group of assigned values corresponding to the fitted function curve group, the parameters of the analyzed interface state can be more accurate since the fitted frequency function curve group can, with the aid of the equivalent model, simultaneously fit the measured capacitance-frequency scatter diagram and the measured conductance-frequency scatter diagram.

10 Claims, 8 Drawing Sheets

METHOD AND APPARATUS FOR ANALYSIS OF INTERFACE STATE OF MIS-HEMT DEVICE

TECHNICAL FIELD

The present disclosure relates to semiconductors, in particular to interface state analysis methods and apparatus of metal-insulator-semiconductor high-electron-mobility transistors (MIS-HEMTs).

BACKGROUND OF THE INVENTION

Gallium nitride (GaN) having the characteristics of wideband gap semiconductor is a new type of semiconductor material developed rapidly after silicon as the first-generation semiconductor and gallium arsenide as the second-generation semiconductor material. Due to its wide band gap, high breakdown electric field, large electron saturation velocity, high thermal conductivity, low dielectric constant, stable chemical property and strong radiation resistance, GaN has been widely used in recent years, especially GaN-based MIS-HEMTs. GaN-based MIS-HEMTs have advantages including high electron mobility of HEMTs, better suppression of gate leakage current and improvement of gate voltage swing and withstand voltage.

It is indispensable to research on MIS-HEMTs to improve the performance of GaN-based MIS-HEMTs. One main problem of a MIS-HEMT device comes from its interface state (including interface trap) which leads to reliability effects including threshold voltage drift and current collapse, bringing great challenges to the manufacturing of trench-gate enhancement devices. In the study of the interface state of MIS-HEMTs, extraction and characterization of density of the interface state really matter.

An electric conductivity method and a capacitance method have been most commonly used in the industry to quantitatively characterize the density distribution varying with energy level in the interface state of a MIS-HEMT device at present. In the electric conductivity method, by means of a gate-stack small-signal model of one MIS-HEMT device, the equivalent parallel capacitance thereof is calculated and a measured conductivity frequency characteristic curve $G_p$-ω is fitted, thereby extracting relevant parameters of the interface state for characterizing the density of the interface state. However, the equivalent parallel capacitance $C_p$ and equivalent parallel conductance $G_p$ of the device are a pair of twin parameters, reflecting the imaginary and real components of the AC equivalent admittance Y of the device respectively; therefore the model with only-conductance fitting fails to accurately represent the AC small-signal characteristics of the device, and the accuracy of the density of interface state density cannot be guaranteed. Referring to FIG. 1, the idea of the capacitance method is to calculate the density of the interface state by means of the frequency dispersion of a measured second step (second slope) of a C-V curve about a relevant MIS-HEMT device. Such method has been proposed because the second step is caused by the interface state, and the change of barrier resistance $R_b$ has little effect on the second step and can be ignored. However, simulation, fitting and other steps are not performed in this method, so it cannot prove that the theories and formulas that the method adopts to calculate the interface-state density are correct and effective, and the calculated result thereof is difficult to guarantee.

SUMMARY OF THE INVENTION

Disclosed are interface state analysis methods and apparatus of MIS-HEMTs, which can simultaneously fit a capacitance-frequency curve and a conductance-frequency curve at any gate voltage, thereby accurately characterizing the distribution of interface-state density with energy level, benefiting the research on device performance.

According to a first aspect, an interface state analysis method of a MIS-HEMT provided in an embodiment may include:

establishing an equivalent model of a MIS-HEMT device to be analyzed, with the MIS-HEMT device including a dielectric layer, a barrier layer and a channel layer, with the equivalent model including a dielectric-layer equivalent circuit representing the electrical characteristics of the dielectric layer, a barrier-layer equivalent circuit representing the electrical characteristics of the barrier layer, a channel-layer equivalent circuit representing the electrical characteristics of the channel layer and an interface-state equivalent circuit representing the electrical characteristics of the interface state between the dielectric layer and the barrier layer, with the dielectric-layer equivalent circuit, the barrier-layer equivalent circuit and the channel-layer equivalent circuit being connected in series, with the interface-state equivalent circuit being connected in parallel to the barrier-layer equivalent circuit, or the interface-state equivalent circuit being connected in parallel to a circuit in which the barrier-layer equivalent circuit is connected in series to the channel-layer equivalent circuit, with the dielectric-layer equivalent circuit at least including a reactance element, the barrier-layer equivalent circuit including a reactance element and a resistive element that are connected in parallel, and the channel-layer equivalent circuit including a reactance element and a resistive element that are connected in series;

acquiring a measured capacitance $C_d$ of the dielectric layer and a measured capacitance $C_b$ of the barrier layer, and taking the capacitance $C_d$ and the capacitance $C_b$ as a parameter about the equivalent reactance element of the dielectric layer and a parameter about the equivalent reactance element of the barrier layer respectively;

measuring an integral capacitance and an integral conductance of the MIS-HEMT device at a preset gate voltage and changing frequencies, and plotting the measured data in a capacitance-frequency diagram and a conductance-frequency diagram to form a measured capacitance-frequency scatter diagram and a measured conductance-frequency scatter diagram;

plotting a function curve, assigning a group of values to parameters about the equivalent resistive element of the barrier layer, the equivalent reactance element of the channel layer, the equivalent resistive element of the channel layer and the interface-state equivalent circuit, substituting the group of assigned values and the capacitance $C_d$ and $C_b$ into the equivalent model to obtain a group of a capacitance-frequency function curve and a conductance-frequency function curve corresponding to the group of assigned values;

repeating the step of plotting the function curve to obtain several groups of capacitance-frequency function curves and conductance-frequency function curves;

comparing the obtained several groups of capacitance-frequency function curves and conductance-frequency function curves in groups with the measured capacitance-frequency scatter diagram and the measured conductance-frequency scatter diagram respectively, screening out a group of a capacitance-frequency function curve and a conductance-frequency function curve that are able to fit the capacitance-frequency scatter diagram and the measured conductance-frequency scatter diagram, and taking such group as a fitted function curve group; and calculating a parameter about the interface state of the MIS-HEMT device according to the group of assigned values corresponding to the fitted frequency function curve group.

According to a second aspect, an interface state analysis apparatus of a MIS-HEMT device may include:

a model establishing unit, configured for establishing an equivalent model of a MIS-HEMT device to be analyzed, with the MIS-HEMT device including a dielectric layer, a barrier layer and a channel layer, with the equivalent model including a dielectric-layer equivalent circuit representing the electrical characteristics of the dielectric layer, a barrier-layer equivalent circuit representing the electrical characteristics of the barrier layer, a channel-layer equivalent circuit representing the electrical characteristics of the channel layer and an interface-state equivalent circuit representing the electrical characteristics of the interface state between the dielectric layer and the barrier layer, with the dielectric-layer equivalent circuit, the barrier-layer equivalent circuit and the channel-layer equivalent circuit being connected in series, with the interface-state equivalent circuit being connected in parallel to the barrier-layer equivalent circuit, or the interface-state equivalent circuit being connected in parallel to a circuit in which the barrier-layer equivalent circuit is connected in series to the channel-layer equivalent circuit, with the dielectric-layer equivalent circuit at least including a reactance element, the barrier-layer equivalent circuit including a reactance element and a resistive element that are connected in parallel, and the channel-layer equivalent circuit including a reactance element and a resistive element that are connected in series;

an acquiring unit, configured for acquiring a measured capacitance $C_d$ of the dielectric layer and a measured capacitance $C_b$ of the barrier layer, and taking the capacitance $C_d$ and the capacitance $C_b$ as a parameter about the equivalent reactance element of the dielectric layer and a parameter about the equivalent reactance element of the barrier layer respectively;

a measuring unit, configured for measuring an integral capacitance and an integral conductance of the MIS-HEMT device at a preset gate voltage and changing frequencies, and plotting the measured data in a capacitance-frequency diagram and a conductance-frequency diagram to form a measured capacitance-frequency scatter diagram and a measured conductance-frequency scatter diagram;

a plotting unit, configured for plotting a function curve, assigning a group of values to parameters about the equivalent resistive element of the barrier layer, the equivalent reactance element of the channel layer, the equivalent resistive element of the channel layer and the interface-state equivalent circuit, substituting the group of assigned values and the capacitance $C_d$ and $C_b$ into the equivalent model to obtain a group of a capacitance-frequency function curve and a conductance-frequency function curve corresponding to the group of assigned values; repeating the step of plotting the function curve to obtain several groups of capacitance-frequency function curves and conductance-frequency function curves; comparing the obtained several groups of capacitance-frequency function curves and conductance-frequency function curves in groups with the measured capacitance-frequency scatter diagram and the measured conductance-frequency scatter diagram respectively, screening out a group of a capacitance-frequency function curve and a conductance-frequency function curve that are able to fit the capacitance-frequency scatter diagram and the measured conductance-frequency scatter diagram, and taking such group as a fitted function curve group; and a computing unit, configured for calculating a parameter about the interface state of the MIS-HEMT device according to the group of assigned values corresponding to the fitted frequency function curve group.

According to the interface state analysis methods and apparatus of MIS-HEMT(s) provided in the aforesaid embodiments, by means of establishing an equivalent model of MIS-HEMT(s) that includes equivalent circuits representing a dielectric layer, a barrier layer and a channel layer, plotting a group of a capacitance-frequency function curve and a conductance-frequency function curve that can be best fitted to the measured capacitance-frequency scatter diagram and the measured conductance-frequency scatter diagram via the equivalent model, taking such best-fitted group as the fitted function curve group, and calculating parameters about the interface state of MIS-HEMT(s) according to the group of assigned values corresponding to the fitted function curve group, the parameters of the analyzed interface state can be more accurate since the fitted frequency function curve group can, with the aid of the equivalent model, simultaneously fit the measured capacitance-frequency scatter diagram and the measured conductance-frequency scatter diagram at any gate voltages.

DETAILED DESCRIPTION

Figure 1:
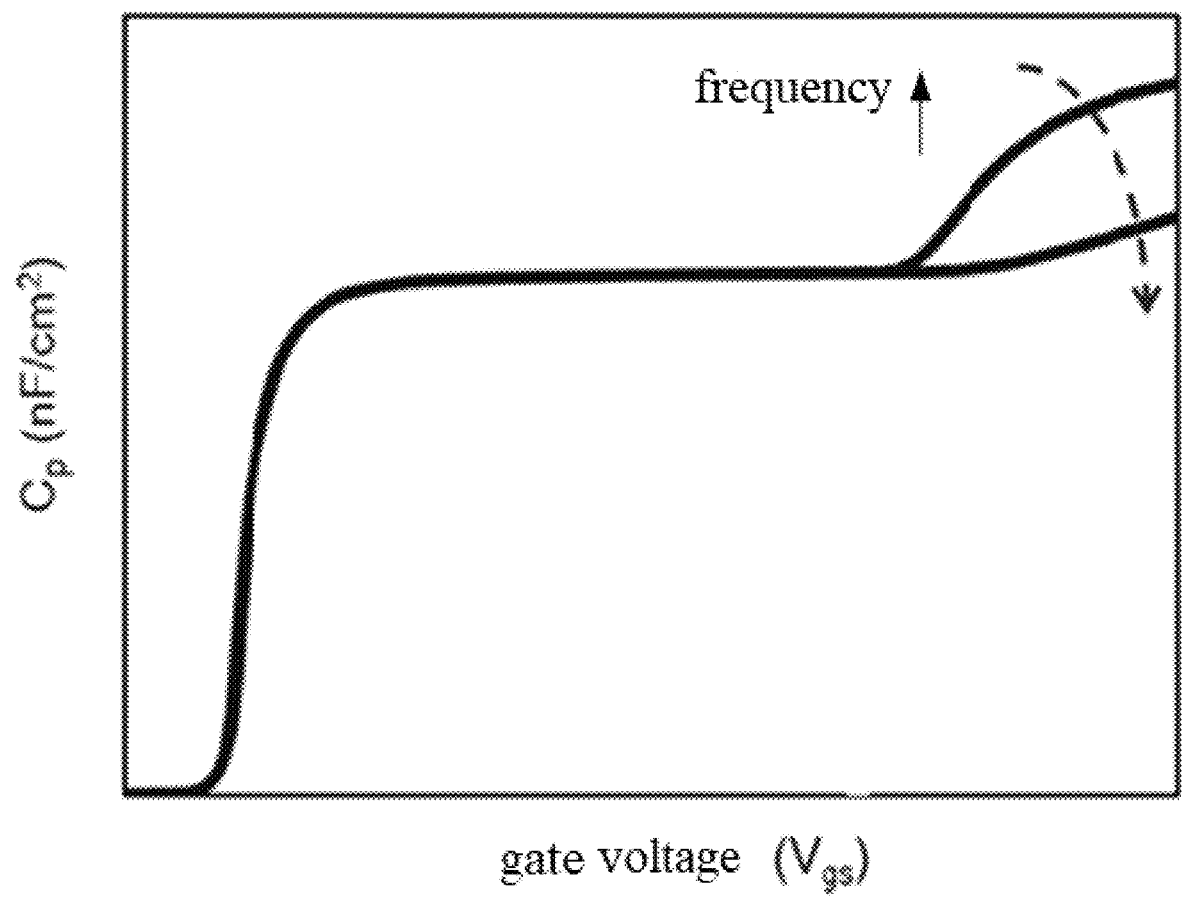
FIG. 1 is a schematic diagram of a conventional interface state analysis method.

The present disclosure will be further described in detail below through specific embodiments with reference to the accompanying drawings. Common or similar elements are referenced with like or identical reference numerals in different embodiments. Many details described in the following embodiments are for the purpose of better understanding the present disclosure. However, those skilled in the art can realize with minimal effort that some of these features can be omitted in different cases or be replaced by other elements, materials and methods. For clarity some operations related to the present disclosure are not shown or illustrated herein so as to prevent the core from being overwhelmed by excessive descriptions. For those skilled in the art, such operations are not necessary to be explained in detail, and they can fully understand the related operations according to the description in the specification and the general technical knowledge in the field.

In addition, the features, operations or characteristics described in the specification may be combined in any suitable manner to form various embodiments. At the same time, the steps or actions in the described method can also be sequentially changed or adjusted in a manner that can be apparent to those skilled in the art. Therefore, the various sequences in the specification and the drawings are only for the purpose of describing a particular embodiment, and are not intended to be an order of necessity, unless otherwise stated one of the sequences must be followed.

The serial numbers of components herein, such as "first", "second", etc., are only used to distinguish the described objects and do not have any order or technical meaning. The terms "connected", "coupled" and the like here include direct and indirect connections (coupling) unless otherwise specified.

Definition of terms used in the disclosure is as follows:

GaN: gallium nitride

MIS-HEMT: metal-insulator-semiconductor high-electron-mobility transistor

MISCAP: metal-insulator-semiconductor capacitor cap

It can be seen from above that there has defects in the electric conductivity method and the capacitance method that characterize interface state in the art.

After analysis, both the capacitance $C_p$ and the conductance $G_p$ are obtained from a measured or simulated total admittance and they are a pair of closely related parameters; accordingly, the model which can simultaneously fit a measured $C_p$-f and $G_p$-f at any gate voltage is possible to be a correct one. In this respect, the density of the interface state extracted by the correct model may be accurate. Therefore, the interface-state density analyzed based on the conductivity method in the art is not accurate enough.

Regarding the capacitance method in the art, firstly, the theoretical basis thereof is that: the second step of the C-V curve comes from the interface state, and the conductance of the barrier layer is assumed to have negligible influence on the step. However, the capacitance method has no data to support such assumption and is not convincing enough. In fact, the model and method involved in the present disclosure can prove that $R_b$ plays an equally important role in generating the second step. Consequently, the density of interface state calculated based on threshold voltage differences of the second step under different frequencies in the capacitance method may lead to inaccurate result. Secondly, the measured data required by the capacitance method is the C-V characteristics under different frequencies, but C-V sweeping may affect the charge distribution of the interface state and the electrons captured by a slow interface state are often too late to be released when voltage sweeping of the next frequency comes, thus the C-V curve scanned at different frequencies may have different threshold voltages, leading to the wrong estimation of the interface-state density.

After the applicant's research, interface state analysis methods and apparatus of MIS-HEMT(s) are proposed in the present disclosure. By means of proposing a gate-stack small-signal model of MIS-HEMT(s), the model including at least three layers, i.e. a dielectric layer, a barrier layer and a channel layer in a physical level, regardless of the value of the gate bias voltage, a capacitance-frequency function curve and a conductance-frequency function curve obtained by this model can simultaneously fit the measured capacitance- and conductance-frequency characteristics. The density and the energy level depth of the interface state can be extracted as fitting parameters via the model; accordingly, the interface-state density varying with the energy level analyzed based on the model is more accurate.

In order to make the purpose, technical solutions, and advantages of the application more clear, the application will be further described in detail below in conjunction with specific embodiments and with reference to the drawings.

First Embodiment

Figure 2:
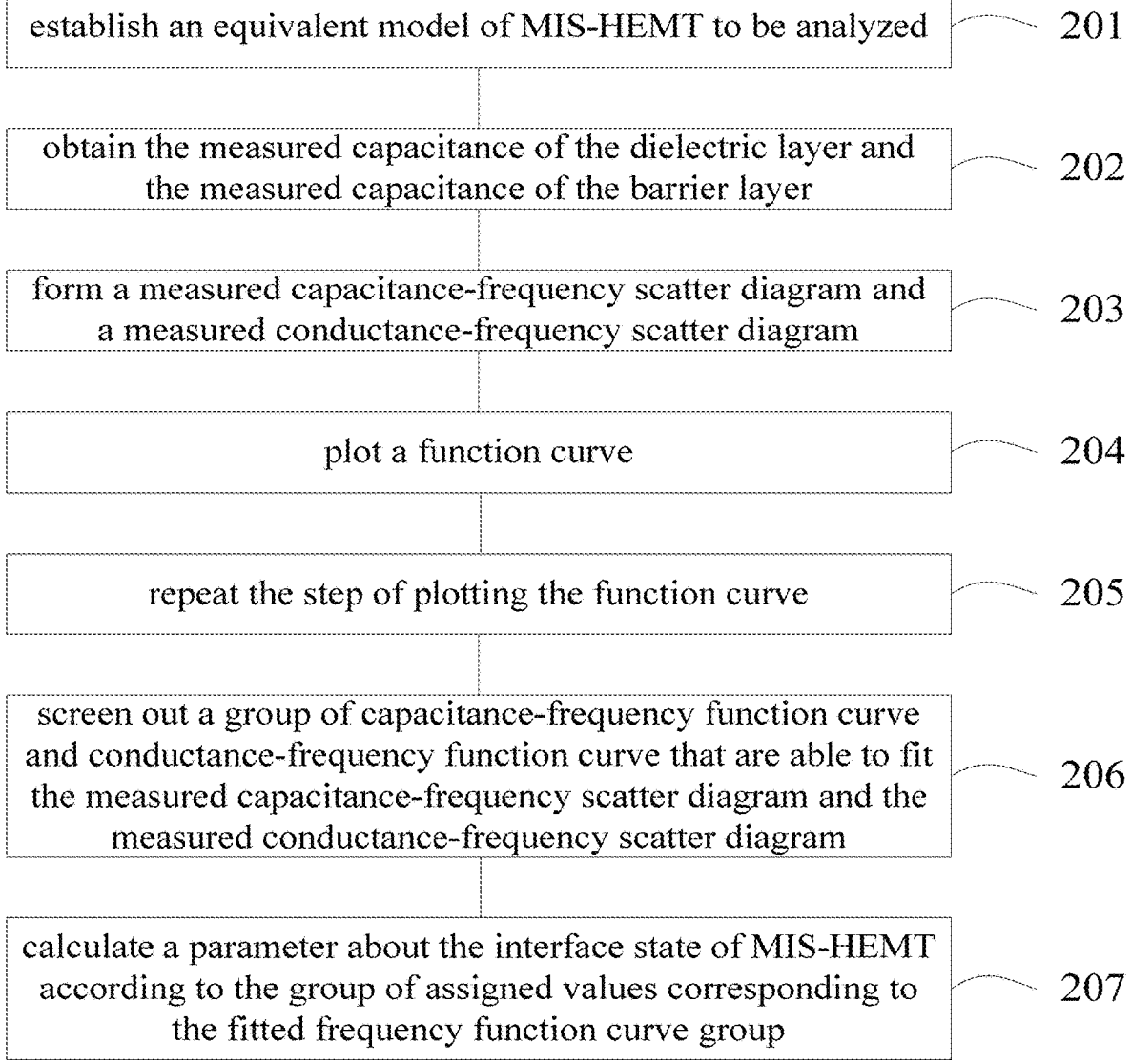
FIG. 2 is a schematic flow chart of interface state analysis method of MIS-HEMT(s) according to an embodiment.

FIG. 2 schematically shows a flow chart of interface state analysis method of MIS-HEMT(s) according to this embodiment. Please refer to FIG. 2, the interface state analysis method of MIS-HEMT(s) provided herein may include the following.

Step 201: establishing an equivalent model of a MIS-HEMT device to be analyzed.

Figure 3:
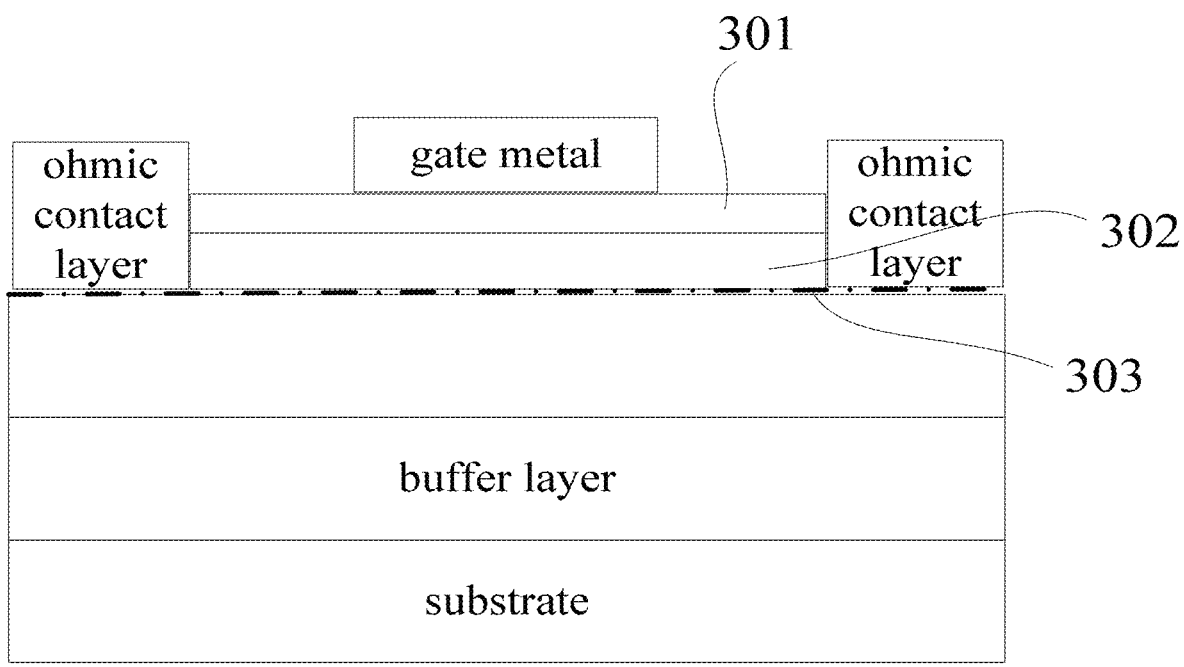
FIG. 3 is a schematic structural diagram of a MIS-HEMT device according to an embodiment.

Referring to FIG. 3, the MIS-HEMT device may include a dielectric layer 301, a barrier layer 302 and a channel layer 303. It shall be noted that in the MIS-HEMT device, the material of the dielectric layer 301 is SiN, the material of the barrier layer 302 is AlGaN material, and a GaN layer is below the barrier layer 302. The GaN layer generally may be called the channel layer, but actually a channel layer may be a two-dimensional electron gas (2DEG) layer generated between the GaN layer and the barrier layer 302. Accordingly, the channel layer 303 in this embodiment refers to the 2DEG layer between the barrier layer 302 and the GaN layer.

Figure 4:
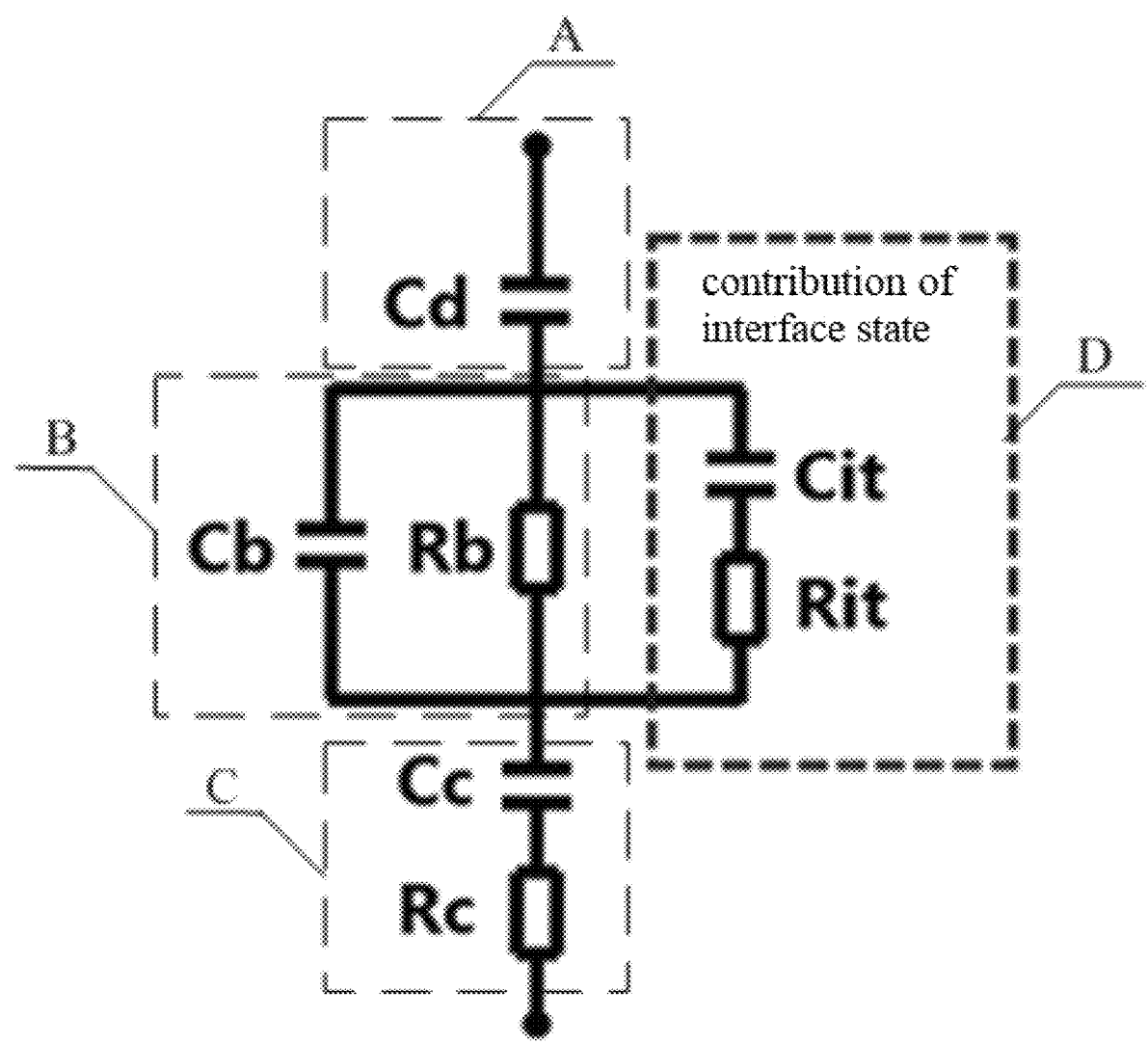
FIG. 4 is a schematic diagram of an equivalent model of a MIS-HEMT device according to an embodiment.

The interface state refers to a local electronic state (surface state) that exists at the heterojunction interface such as a metal-semiconductor interface, a semiconductor-insulator interface, and a semiconductor-semiconductor. In order to study parameters of the interface state of the MIS-HEMT device, it is necessary to establish a gate-stack small-signal equivalent model of the MIS-HEMT device to be analyzed (hereinafter referred to as the equivalent model). As shown in FIG. 4, the equivalent model proposed herein may include a dielectric-layer equivalent circuit A representing the electrical characteristics of the dielectric layer 301, a barrier-layer equivalent circuit B representing the electrical characteristics of the barrier layer 302, a channel-layer equivalent circuit C representing the electrical characteristics of the channel layer 303, and an interface-state equivalent circuit D representing the electrical characteristics of the interface state between the dielectric layer and the barrier layer. The dielectric-layer equivalent circuit A, the barrier-layer equivalent circuit B and the channel-layer equivalent circuit C are connected in series in sequence. The interface-state equivalent circuit D is connected in parallel with the barrier-layer equivalent circuit B, or the interface-state equivalent circuit D is connected in parallel with a circuit in which the barrier-layer equivalent circuit B is connected in series with the channel-layer equivalent circuit C.

In some embodiments, more levels of equivalent circuits such as an ohmic-contact-layer equivalent circuit may also be introduced into the equivalent model, and the ohmic-contact-layer equivalent circuit may be connected in series with other equivalent circuits.

Resistance and reactance may always coexist in electricity, therefore resistance (or conductance) and capacitance can be adopted to represent each level. In some embodiments, the dielectric-layer equivalent circuit A may at least include a reactance element, the barrier-layer equivalent circuit B may include a reactance element and a resistive element that are connected in parallel; and the channel-layer equivalent circuit C may include a reactance element and a resistive element that are connected in series.

In some embodiments, the dielectric-layer equivalent circuit A may further include a resistive element that is connected in parallel with the reactance element.

It shall be noted that since the reactance element and the resistive element are connected in parallel in the barrier layer, in which the capacitance of the reactance element is obtained by measured C-V characteristics, and the resistance of the paralleled resistive element gradually is decreased as the increase of the gate voltage, the resistive element of the barrier layer consequently shall not be neglected. When the influence of $R_b$ is neglected, the amplitude of the second step and the frequency dispersion at low frequencies are far from actual measurements.

Please continue to refer to FIG. 4, in one embodiment, the dielectric-layer equivalent circuit A may include a reactance element $C_d$, the barrier-layer equivalent circuit B may include a reactance element $C_b$ and a resistive element $R_b$ that are connected in parallel, the channel-layer equivalent circuit C may include a reactance element $C_c$ and a resistive element $R_c$ that are connected in series, and the interface-state equivalent circuit D may include a reactance element $C_{it}$ and a resistive element $R_{it}$ that are connected in series.

The interface-state equivalent circuit D as a branch is formed by connecting an interface-state capacitance $C_{it}$ in series to an interface-state resistance $R_{it}$. The branch may be connected in parallel to both ends of the barrier-layer equivalent circuit, or in parallel in a range beyond the barrier layer (such as it is connected to both ends of the barrier-layer equivalent circuit and the channel-layer equivalent circuit), but one end thereof shall be located between the dielectric-layer equivalent circuit A and the barrier-layer equivalent circuit B, because the interface state studied comes from the interface between the dielectric layer and the barrier layer of the device.

In some embodiments, the above-mentioned reactance element may be a capacitance, and the resistive element may be a resistance.

Step 202: acquiring a measured capacitance $C_d$ of the dielectric layer and a measured capacitance $C_b$ of the barrier layer.

One purpose of acquiring the measured capacitance $C_d$ of the dielectric layer and the measured capacitance $C_b$ of the barrier layer is to use the measured capacitance $C_d$ and the measured capacitance $C_b$ as a parameter value about the equivalent reactance element of the dielectric layer 301 and a parameter value about the equivalent reactance element of the barrier layer, respectively.

In this embodiment, a way to acquire the measured capacitance $C_d$ of the dielectric layer and the measured capacitance $C_b$ of the barrier layer may include the following:

first, obtaining a C-V curve about the integral capacitance of the MIS-HEMT device with different gate voltages; and then acquiring the measured capacitance $C_d$ of the dielectric layer and the measured capacitance $C_b$ of the barrier layer by a calculation according to the capacitance corresponding to the first step (first slope) and the second step of the C-V curve, wherein the first step and the second step respectively represent the positions of two steps that appear one after another in the C-V curve.

In this embodiment, the integral measured capacitance and conductance of the MIS-HEMT device may be obtained by using the CMU module of the Keithley 4200 Semiconductor Tester, in which its positive electrode is connected to the gate of the device, and the negative electrode is connected to the source of the device. Then the C-V curve of the integral capacitance of the MIS-HEMT device varied with different gate voltages (shortly for C-V curve) is plotted, wherein the capacitance of the second step on the C-V curve corresponds to the value of $C_d$, and the capacitance of the first step corresponds to equivalent series capacitance of $C_b$ and $C_d$, namely $1/(1/C_d+1/C_b)$, and $C_b$ can be obtained.

Step 203, forming a measured capacitance-frequency scatter diagram and a measured conductance-frequency scatter diagram.

The integral capacitance and the integral conductance of the MIS-HEMT device at any preset gate voltages and changing frequencies may be measured, and the measured data may be plotted on a capacitance-frequency diagram and a conductance-frequency diagram so as to form the measured capacitance-frequency scatter diagram and the measured conductance-frequency scatter diagram.

Figure 5:
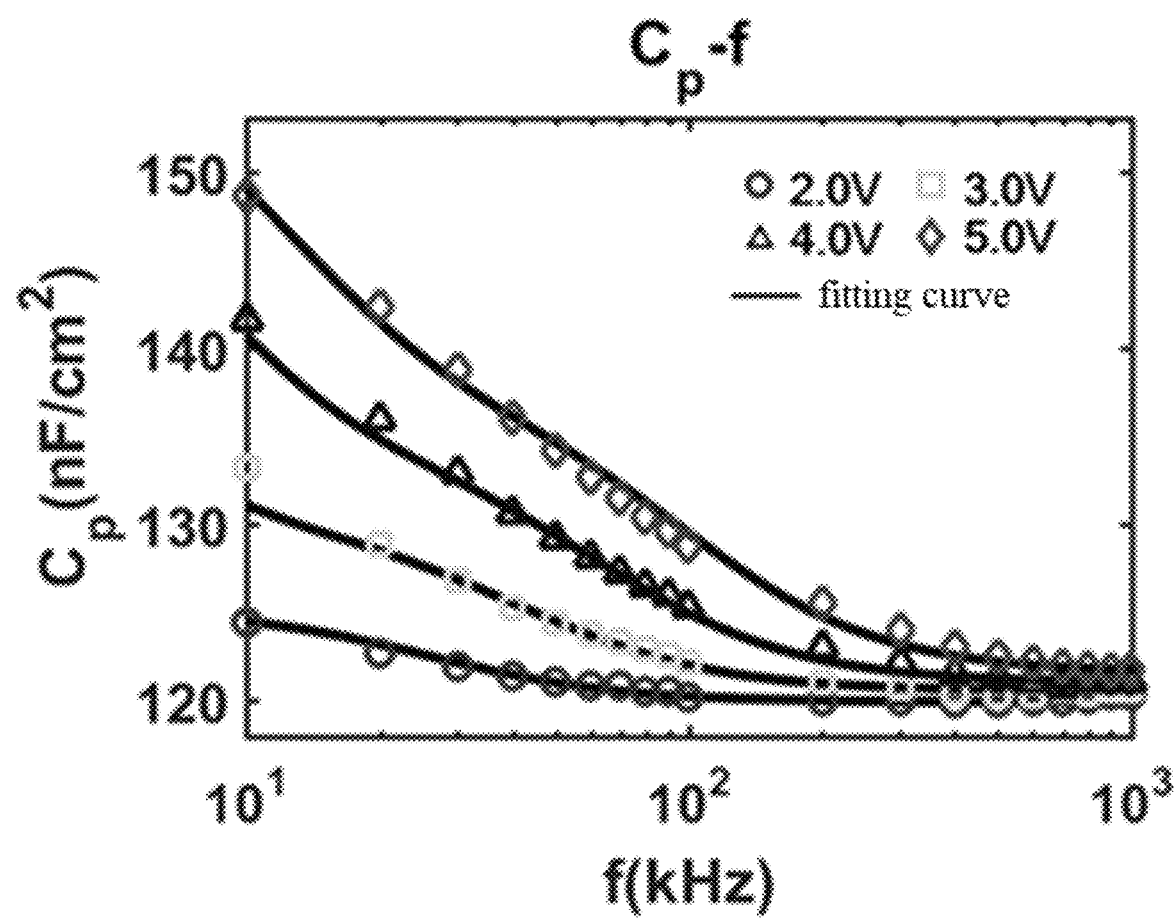
FIG. 5 is a schematic diagram of a measured capacitance-frequency scatter diagram and a fitted capacitance-frequency function curve according to an embodiment.
Figure 6:
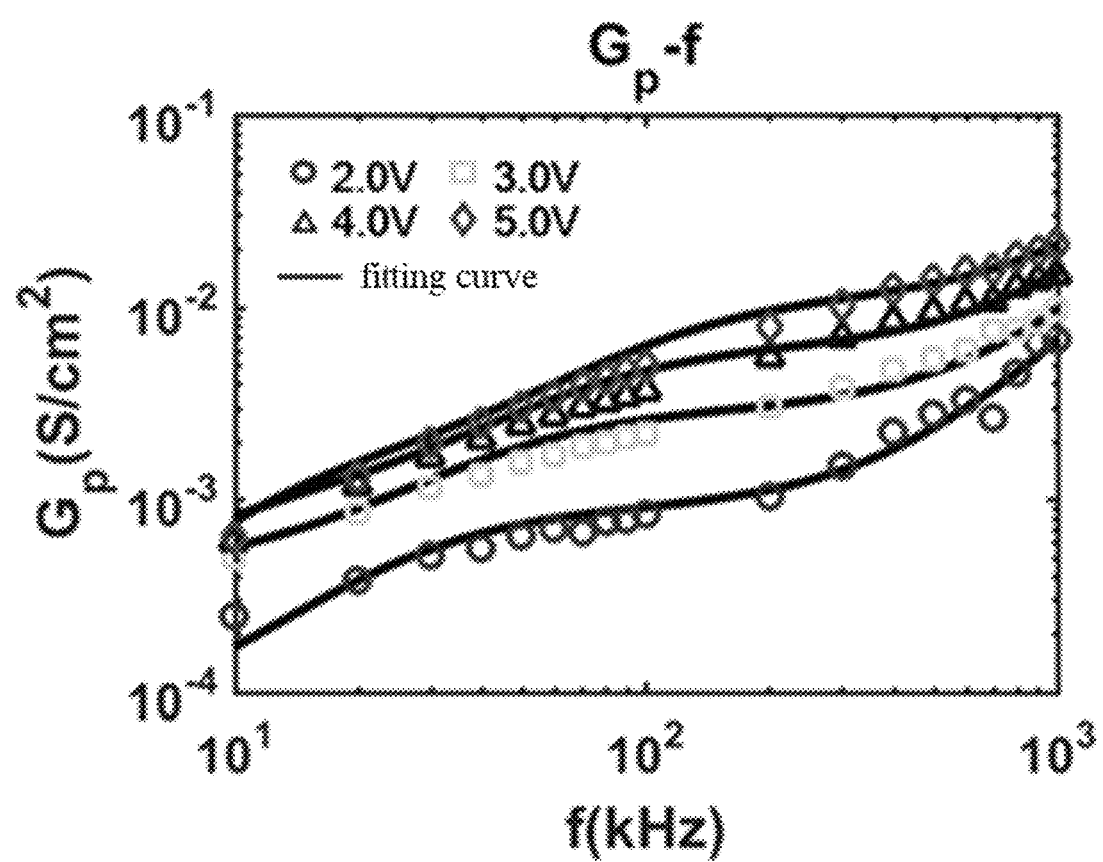
FIG. 6 is a schematic diagram of a measured conductance-frequency scatter diagram and a fitted conductance-frequency function curve according to an embodiment.

In this embodiment, the measured data may be plotted on the capacitance-frequency scatter diagram and the conductance-frequency scatter diagram with preset gate voltages of 2V, 3V, 4V and 5V, to which the distribution of scattered points in FIG. 5 and FIG. 6 may be referred. Each groups of scattered points with a same shape in FIG. 5 represents the integral capacitance of different frequencies at an identical preset voltage, and each groups of scattered points with the same shape in FIG. 6 represents the integral conductance of different frequencies at an identical preset voltage.

Step 204, plotting a function curve.

The step of plotting the function curve may be performed by assigning a group of values to parameters about the equivalent resistive element of the barrier layer, the equivalent reactance element of the channel layer, the equivalent resistive element of the channel layer and the interface-state equivalent circuit, respectively, and substituting the group of assigned values and the aforementioned capacitance $C_d$ and $C_b$ into the equivalent model to acquire a group of capacitance-frequency function curve (Cp-f) and conductance-frequency function curve (Gp-f) corresponding to the group of assigned values.

The step of acquiring $C_p$-f and $G_p$-f by the equivalent model may include as follows:

according to the AC circuit of the equivalent model, calculating the equivalence impedance Z of the entire MIS-HEMT device with the capacitance C expressed as $1/j\omega C$ and the impedance R expressed as R, further gaining an equivalent admittance $Y=1/Z$; and calculating the equivalent parallel capacitance $Cp(\omega)$ and the equivalent parallel conductance $Gp(\omega)$ of the MIS-HEMT device based on the admittance Y with a relevant calculation formula: $C_p=\text{imag}(Y)/j\omega$, $G_p=\text{real}(Y)$, where imag( ) refers to a function to find the imaginary part of a complex number, and real( ) refers to a function to find the real part of a complex number.

Step 205: repeating the step of plotting the function curve to obtain several groups of capacitance-frequency function curves and conductance-frequency function curves.

The step of repeating plotting the function curves may mean that it may be performed by assigning values to parameters about the equivalent resistive element of the barrier layer, the equivalent reactance element of the channel layer, the equivalent resistive element of the channel layer and the interface-state equivalent circuit for multiple times respectively, and substituting the multiple groups of assigned values and the aforementioned capacitance $C_d$ and $C_b$ into the equivalent model so as to acquire multiple groups of capacitance-frequency function curves and conductance-frequency function curves corresponding to the multiple groups of assigned values.

It shall be noted that the number of the step of repeating plotting function curves may be 0, 1, 2, 3 or any other times, and may be determined by whether a fitted function curve group can be screened out (the method for screening will be explained in detail below).

Step 206: screening out a group of capacitance-frequency function curve and conductance-frequency function curve that may be able to fit the capacitance-frequency scatter diagram and the measured conductance-frequency scatter diagram.

The obtained multiple groups of capacitance-frequency function curves and conductance-frequency function curves are respectively compared in groups with the measured capacitance-frequency scatter diagram and the measured conductivity-frequency scatter diagram to screen out a group of capacitance-frequency function curve and conductance-frequency function curve that may be able to fit the measured capacitance-frequency scatter diagram and the measured conductance-frequency scatter diagram. Such screened-out group may be taken as the fitted function curve group, to which the continuous curves in FIG. 5 and FIG. 6 may be referred, wherein the continuous curve shown in FIG. 5 fit the measured capacitance-frequency scatter diagram at a corresponding position, and the continuous curve shown in FIG. 6 fit the measured capacitance-frequency scatter diagram at a corresponding position.

In some embodiments, a group of values may first be assigned in the above-mentioned method for screening out the fitted function curve group, that is, a group of values may be firstly assigned to parameters about the equivalent resistive element of the barrier layer, the equivalent reactance element of the channel layer, the equivalent resistive element of the channel layer and the interface-state equivalent circuit respectively to obtain the capacitance-frequency function curve and the conductance-frequency function curve corresponding to the group of values, then they may be compared and fitted to the measured capacitance-frequency scatter diagram and the measured conductance-frequency scatter diagram. When the degree of fitting is relatively low, the assigned values may be adjusted until a curve with a higher degree of fitting is obtained; and when the curve with a higher degree of fitting is obtained, the curve with such higher fitting degree may be regarded as the fitted function curve group.

In some embodiments, multiple groups of values may first be assigned in the above-mentioned method for screening out the fitted function curve group, that is, multiple groups of values may firstly be assigned to parameters about the equivalent resistive element of the barrier layer, the equivalent reactance element of the channel layer, the equivalent resistive element of the channel layer and the interface-state equivalent circuit respectively to obtain groups of the capacitance-frequency function curves and the conductance-frequency function curves corresponding to the multiple groups of values, then they may be compared and fitted to the measured capacitance-frequency scatter diagram and the measured conductance-frequency scatter diagram. The capacitance-frequency function curve and conductance-frequency function curve corresponding to the highest degree of fitting may be selected to be taken as the fitted function curve group.

It shall be noted that the assignment mentioned above may be realized by assigning values to each individual parameter by human and performing adjustment thereto until the adjusted parameters can be used to obtain curves that coincide with actual curves, i.e., adopting the adjusted parameters can acquire curves that may be able to fit the measured capacitance-frequency scatter diagram and the measured conductance-frequency scatter diagram with a fitting degree visible to the naked eye. The adjustment here may be performed in a rough way first and then in a fine manner. It shall be noted that when the established equivalent model is incorrect, the curve obtained by adjusted parameters fails to be coincided with the measured capacitance-frequency scatter diagram and the measured conductance-frequency scatter diagram even though the curve is best fitted to the latter, or it may only fit one of the capacitance-frequency characteristics and the conductance-frequency characteristics but not both of them simultaneously, or it may perform fitting under certain gate voltages and fails to fit under other gate voltages.

It shall be noted that when plotting the function curve, the resistance of the channel layer decreases as the gate voltage increases and the capacitance of the channel layer increases as the gate voltage increases in the region of the first step, and the resistance of the barrier layer and that of the interface-state resistance decrease as the gate voltage increases in the region of the second step. Accordingly, during the process of assigning values to each individual parameter by human and performing adjustment thereto, the assigned values can be adjusted according to such changing rule of the parameters about the barrier layer and the channel layer corresponding to the regions of the first and second steps varying with the gate voltages. When the parameters can be adjusted with the rule, the adjustment may be carried out more quickly to obtain an optimal group of assigned values, that is, the fitted function curve group can be obtained by a quick fitting. In this respect, when the measured capacitance-frequency scatter diagram and the measured conductance-frequency scatter diagram can be fitted by a certain model, and the extracted parameters fail to meet the above changing rule, the model may also be regarded as a wrong model and an equivalent model may be re-established.

It shall be noted that the fitting mentioned in this embodiment may refer to the best fit measurement to the capacitance-frequency scatter diagram and the measured conductance-frequency scatter diagram.

Step 207, calculating the parameters about the interface state of the MIS-HEMT device according to the group of assigned values corresponding to the fitted frequency function curve group.

The group of assigned values corresponding to the fitted frequency function curve group may include the parameter values about the equivalent resistive element of the barrier layer, the equivalent reactance element of the channel layer, the equivalent resistive element of the channel layer and the interface-state equivalent circuit. Any value(s) in the group of assigned values may be extracted for subsequent research as needed. Generally, the parameter values about the interface-state equivalent circuit need to be extracted when computing the parameters about interface state of the MIS-HEMT device.

In an embodiment, the parameters about the interface state of the MIS-HEMT device may be computed according to the assigned values of the equivalent reactance element $C_{it}$ and the resistive element $R_{it}$ of the interface state corresponding to the fitted frequency function curve group.

In the embodiment, the parameters about the interface state may include an interface-state density and/or the depth of interface-state energy level; wherein the interface-state density may be calculated according to the parameters about the interface-state equivalent reactance element $C_{it}$ corresponding to the fitted frequency function curve group, and the depth of interface-state energy level may be calculated according to the parameters about the interface-state equivalent resistive element $R_{it}$ corresponding to the fitted frequency function curve group.

In this embodiment, the calculation of the interface-state density based on the interface-state equivalent capacitance $C_{it}$ and the calculation of the depth of interface-state energy level based on the interface-state equivalent resistance $R_{it}$ can be performed respectively with the following formulas:

$$\tau_{it} = \frac{1}{v_{th}\sigma_n N_c}\exp\left(\frac{E_C - E_T}{kT}\right)$$

$$D_{it} = C_{it}/q$$

where $v_{th}$ is a constant and $v_{th}=2\times10^7$ cm/s, $\sigma_n$ is a constant and $\sigma_n=1\times10^{-14}$ cm$^2$, $N_c$ is a constant and $N_c=4.3\times10^{14}\times T^{3/2}$ cm$^{-2}$, and T represents a temperature and T=300K in this embodiment.

Figure 7:
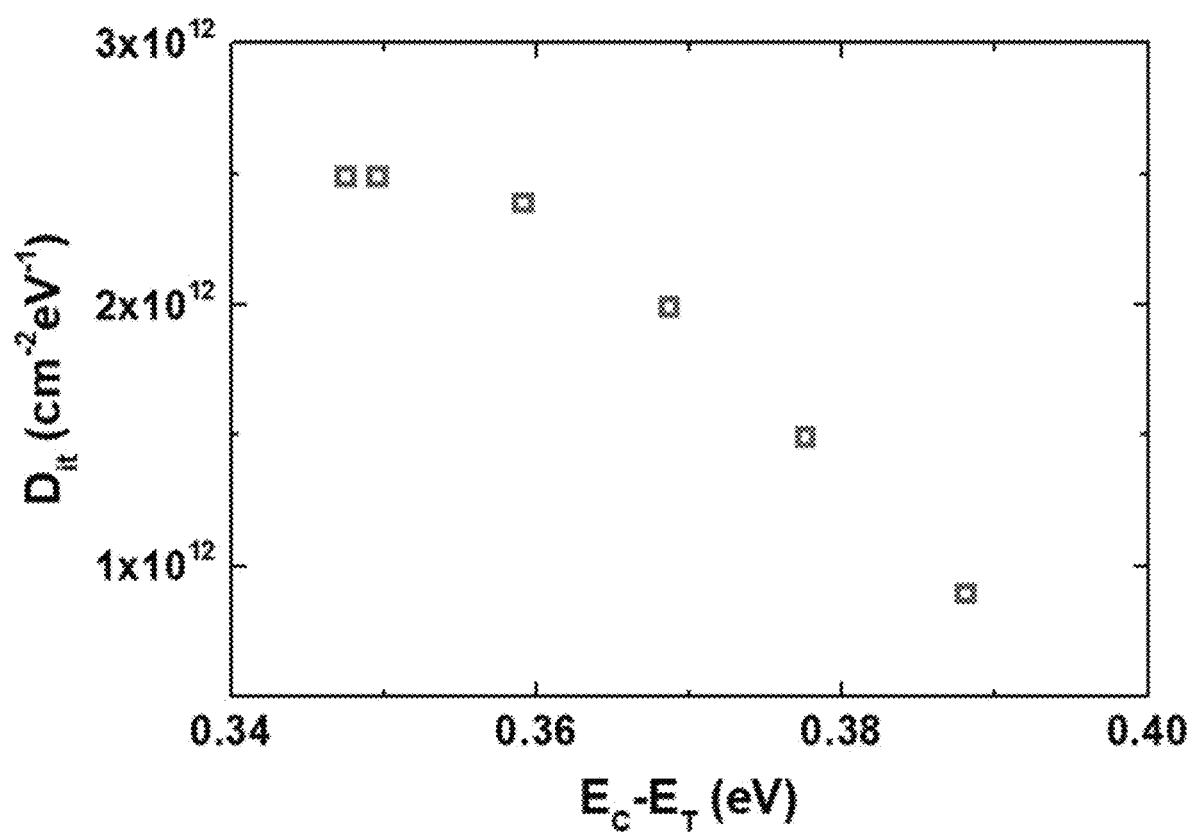
FIG. 7 is a schematic diagram characterizing the distribution of the interface-state density varying with the energy level according to an embodiment.

It shall be noted that the interface state can cause reliability effects such as threshold voltage drift and current collapse, affecting the manufacturing process of recessed-gate semiconductor devices. Therefore, in the research on the manufacturing process of MIS-HEMT(s), the effective characterization of the interface state can help the improvement of techniques of MIS-HEMT(s). Since the interface-state density of a same MIS-HEMT device varies at different depths of energy level, the distribution of interface-state density following the interface-state energy level may generally be regarded as the characterization of the interface state of the device by those skilled in the art. FIG. 7 is a schematic diagram of the characterizing result of interface state according to an embodiment. Referring to FIG. 7 in which the horizontal axis $E_C$-$E_T$ represents the depth of interface-state energy level of MIS-HEMT(s) and the vertical axis $D_{it}$ represents the interface-state density of MIS-HEMT(s), the maximum interface-state density of the MIS-HEMT device can be accurately obtained in the figure, and the distribution of the scattered points may also illustrate the distribution of the interface-state density of the MIS-HEMT device varying with the energy level. When researching the manufacturing process of MIS-HEMT(s) based on gate-stack model, the distribution of the interface-state density of the MIS-HEMT device varying with the energy level can be studied by the analysis method proposed herein to come to a conclusion that for example the interface-state density of the MIS-HEMT device may be relatively large at a certain energy level. After the process of the device is improved, the analysis method proposed herein may be carried out again to study the distribution of the interface-state density of the MIS-HEMT device varying with the energy level; in this respect, if the interface-state density at a same energy level becomes smaller, it can be considered that the improved process is effective and may be used in the production of the device, otherwise the process may need to be improved.

Figure 8:
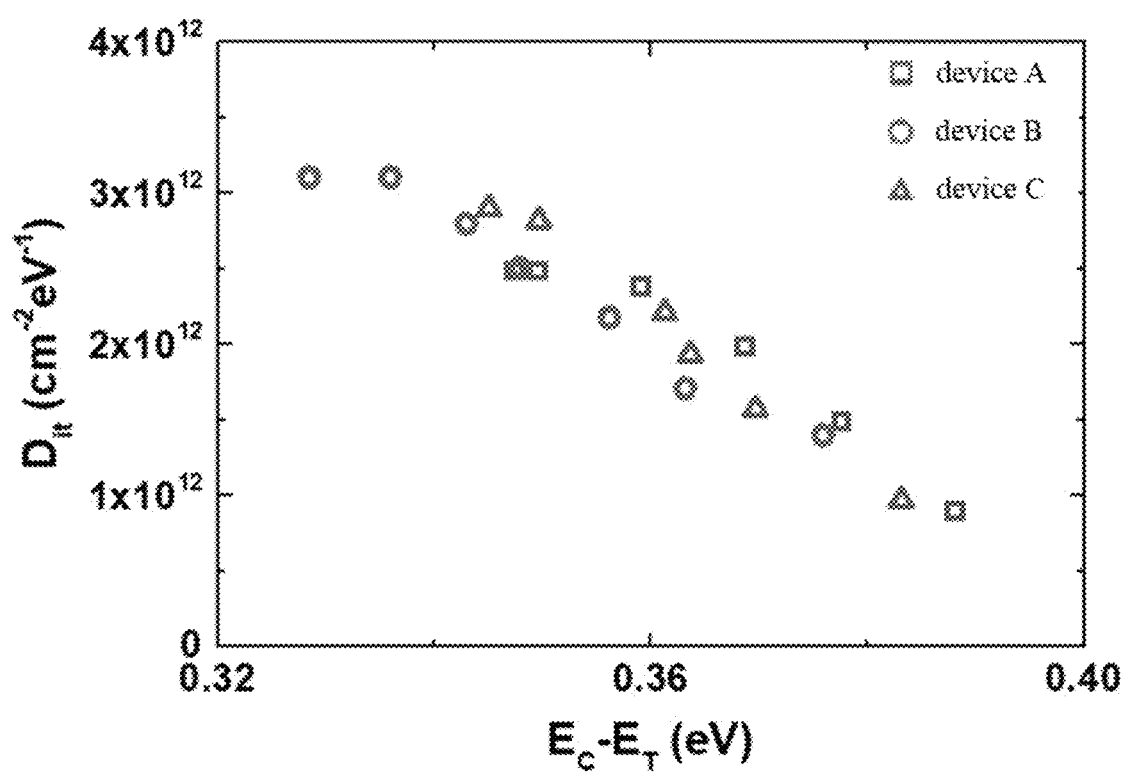
FIG. 8 is a comparison diagram characterizing the distribution of the interface-state density of different devices varying with the energy level according to an embodiment.

Referring to FIG. 8, which schematically shows the distribution of the interface-state density varying with the energy levels in different MIS-HEMTs that is characterized by the method of the present disclosure, the parameters about the interface state of three devices A, B, C of different sizes are studied with the method proposed herein. In the shown embodiment, the three devices A, B, C of different sizes are MIS-HEMTs each having a circular gate metal layer with a radius R of 50 um, 40 um, 30 um, respectively. During studying, for each of all the three devices A, B, C of different sizes, the model is able to fit the measured $C_p$-f and $G_p$-f simultaneously no matter it is used in the device to fit the measured $C_p$-f and $G_p$-f near the first step (that is the selected $V_{gs}$ are within the region of the first step) or near the second step (that is the selected $V_{gs}$ are within the region of the second step).

The distributions of the "square, circular and triangular" scattered points represent the distribution of the interface-state density varying with the energy level in the three devices A, B, C, respectively. It can be seen that with the method proposed herein different devices may offer good uniformity, which also proves that the interface-state density and the energy level depth characterized by the method proposed in the present disclosure are more accurate.

It can be seen from the above that with the equivalent model of a MIS-HEMT device proposed in the present disclosure, the fitted frequency function curve group which is able to simultaneously fit the measured capacitance-frequency scatter diagram and the measured conductance-frequency scatter diagram of the MIS-HEMT device can be obtained, which shows that the model proposed by the present disclosure is closer to the real situation of the HEMT device, so that the interface-state density and energy level depth measured by the equivalent model are more accurate.

Second Embodiment

An interface state analysis apparatus of a MIS-HEMT device provided in the present embodiment may include:

a model establishing unit, configured for establishing an equivalent model of the MIS-HEMT device to be analyzed, wherein the MIS-HEMT device may include a dielectric layer, a barrier layer and a channel layer; the equivalent model may include a dielectric-layer equivalent circuit representing the electrical characteristics of the dielectric layer, a barrier-layer equivalent circuit representing the electrical characteristics of the barrier layer, a channel-layer equivalent circuit representing the electrical characteristics of the channel layer, and an interface-state equivalent circuit representing the electrical characteristics of the interface state between the dielectric layer and the barrier layer; the dielectric-layer equivalent circuit, the barrier-layer equivalent circuit and the channel-layer equivalent circuit are connected in series in sequence, the interface-state equivalent circuit and the barrier-layer equivalent circuit are connected in parallel, or the interface-state equivalent circuit is connected in parallel with a circuit in which the barrier-layer equivalent circuit is connected in series with the channel-layer equivalent circuit; the dielectric-layer equivalent circuit at least includes a reactance element, the barrier-layer equivalent circuit includes a reactance element and a resistive element that are connected in parallel, and the channel-layer equivalent circuit includes a reactance element and a resistive element that are connected in series;

an acquiring unit, configured for acquiring a measured capacitance $C_d$ of the dielectric layer and a measured capacitance $C_b$ of the barrier layer, and taking the capacitance $C_d$ and $C_b$ as a parameter about the equivalent reactance element of the dielectric layer and a parameter about the equivalent reactance element of the barrier layer, respectively;

a measuring unit, configured for measuring the integral capacitance and the integral conductance of the MIS-HEMT device at a preset gate voltage and a changing frequency, and plotting measured data in a capacitance-frequency diagram and a conductance-frequency diagram to form a measured capacitance-frequency scatter diagram and a measured conductance-frequency scatter diagram;

a plotting unit, configured for plotting a function curve, assigning a group of values to the parameters of the equivalent resistive element of the barrier layer, the equivalent reactance element of the channel layer, the equivalent resistive element of the channel layer and the interface-state equivalent circuit respectively, and substituting the group of assigned values and the capacitance $C_d$ and $C_b$ into the equivalent model to acquire a group of capacitance-frequency function curve and conductance-frequency function curve corresponding to the group of assigned values; repeating the step of plotting the function curve to obtain several groups of capacitance-frequency function curves and conductance-frequency function curves; comparing the obtained several groups of capacitance-frequency function curves and conductance-frequency function curves in groups with the measured capacitance-frequency scatter diagram and the measured conductivity-frequency scatter diagram respectively to screen out a group of capacitance-frequency function curve and conductance-frequency function curve that are able to fit the measured capacitance-frequency scatter diagram and the measured conductance-frequency scatter diagram, and taking the screened group as a fitted function curve group; and a computing unit, configured for calculating a parameter about the interface state of the MIS-HEMT device according to the group of assigned values corresponding to the fitted frequency function curve group.

In the present embodiment, by means of an equivalent model established by the model establishing unit and the measured capacitance $C_d$ and the measured capacitance $C_b$ of the barrier layer obtained by the acquiring unit, as well as substituting unknown components in each individual equivalent circuit of the equivalent model that have been assigned with values into the equivalent model, the fitted frequency function curve group that is able to fit the measured capacitance-frequency scatter diagram and the measured conductance-frequency scatter diagram of the MIS-HEMT device simultaneously can be obtained; accordingly, the parameters about the interface state of the MIS-HEMT device can be calculated by the computing unit, therefore the related results about the interface state analyzed by the interface state analysis apparatus provided in the embodiment are more accurate.

The present disclosure is illustrated with reference to various exemplary embodiments. However, those skilled in the art may recognize that changes and modifications can be made to the exemplary embodiments without departing from the scope of the present disclosure. For example, various operation steps and components used to perform the operation steps can be implemented in different ways according to a specific application or any cost functions associated with the operation of the system (for example, one or more steps can be deleted, modified or incorporated into other steps).

Although the principles of the present disclosure have been shown in various embodiments, many modifications of structures, arrangements, proportions, elements, materials, and components that are particularly suitable for specific environments and operating requirements can be made and used without departing from the principles and scope of this disclosure. The above modifications and other changes or amendments can be included in the scope of the present disclosure.

The foregoing detailed description has been illustrated with reference to various embodiments. However, those skilled in the art will recognize that various modifications and changes can be made without departing from the scope of the present disclosure. Therefore, the consideration of the disclosure will be in an illustrative rather than restrictive sense, and all these modifications will be included in its scope. Likewise, the advantages, other advantages, and solutions to problems of the various embodiments have been described above. However, benefits, advantages, solutions to problems, and any solutions that can produce these or make them more specific should not be construed as critical, necessary, or indispensable. The term "including" and any other variants thereof used herein are non-exclusive inclusions. Such a process, method, article or device that includes a list of elements not only includes these elements, but also includes those that are not explicitly listed or are not part of the process, methods, systems, articles or other elements of devices. In addition, the term "coupled" and any other variations thereof used herein may refer to physical connection, electrical connection, magnetic connection, optical connection, communication connection, functional connection and/or any other connection.

Those skilled in the art may recognize that many changes can be made to the details of the above-described embodiments without departing from the basic principles of the present disclosure. Therefore, the scope of the present disclosure shall be determined according to the following claims.

The invention claimed is:

1. A method for analysis of interface state of MIS-HEMT device, comprising:

establishing an equivalent model of a MIS-HEMT device to be analyzed, the MIS-HEMT device including a dielectric layer, a barrier layer and a channel layer, the equivalent model including a dielectric-layer equivalent circuit representing the electrical characteristics of the dielectric layer, a barrier-layer equivalent circuit representing the electrical characteristics of the barrier layer, a channel-layer equivalent circuit representing the electrical characteristics of the channel layer and an interface-state equivalent circuit representing the electrical characteristics of the interface state between the dielectric layer and the barrier layer, the dielectric-layer equivalent circuit, the barrier-layer equivalent circuit and the channel-layer equivalent circuit being connected in series, the interface-state equivalent circuit being connected in parallel to the barrier-layer equivalent circuit, or the interface-state equivalent circuit being connected in parallel to a circuit in which the barrier-layer equivalent circuit is connected in series with the channel-layer equivalent circuit, the dielectric-layer equivalent circuit at least including a reactance element, the barrier-layer equivalent circuit including a reactance element and a resistive element that are connected in parallel, and the channel-layer equivalent circuit including a reactance element and a resistive element that are connected in series;

acquiring a measured capacitance $C_d$ of the dielectric layer and a measured capacitance $C_b$ of the barrier layer, and taking the capacitance $C_d$ and $C_b$ as a parameter about the equivalent reactance element of the dielectric layer and a parameter about the equivalent reactance element of the barrier layer respectively;

measuring an integral capacitance and an integral conductance of the MIS-HEMT device at a preset gate voltage and changing frequencies, and plotting measured data in a capacitance-frequency diagram and a conductance-frequency diagram to form a measured capacitance-frequency scatter diagram and a measured conductance-frequency scatter diagram;

plotting a function curve, assigning a group of values to the parameters about the equivalent resistive element of the barrier layer, the equivalent reactance element of the channel layer, the equivalent resistive element of the channel layer and the interface-state equivalent circuit respectively, and substituting the group of assigned values and the capacitance $C_d$ and $C_b$ into the equivalent model to obtain a group of a capacitance-frequency function curve and a conductance-frequency function curve corresponding to the group of assigned values;

repeating the step of plotting the function curve to obtain several groups of capacitance-frequency function curves and conductance-frequency function curves;

comparing the obtained several groups of capacitance-frequency function curves and conductance-frequency function curves in groups with the measured capacitance-frequency scatter diagram and the measured conductance-frequency scatter diagram respectively, screening out a group of a capacitance-frequency function curve and a conductance-frequency function curve that are able to fit the capacitance-frequency scatter diagram and the measured conductance-frequency scatter diagram, and taking such group as a fitted function curve group; and calculating a parameter about the interface state of the MIS-HEMT device according to the group of assigned values corresponding to the fitted frequency function curve group.

2. The method according to claim 1, wherein the dielectric-layer equivalent circuit further comprises a resistive element that is connected in parallel with the reactance element.

3. The method according to claim 1, wherein the interface-state equivalent circuit comprises a reactance element and a resistive element that are connected in series, such series-connected reactance element and resistive element are connected in parallel with the barrier-layer equivalent circuit, or such series-connected reactance element and resistive element are connected in parallel with a circuit in which the barrier-layer equivalent circuit is connected in series with the channel-layer equivalent circuit.

4. The method according to claim 3, wherein the step of assigning values to the parameters of the interface-state equivalent circuit comprises:

assigning a group of values to the parameters about the reactance element of the interface state and the resistive element of the interface state respectively;

correspondingly: the step of calculating a parameter about the interface state of the MIS-HEMT device according to the group of assigned values corresponding to the fitted frequency function curve group comprises:

according to the assigned value of the parameters about the reactance element and the resistive element of the interface state corresponding to the fitted frequency function curve group, calculating the parameter about the interface state of the MIS-HEMT device.

5. The method according to claim 3, wherein the parameter about the interface state comprises the density of the interface state and/or the depth of the energy level of the interface state, the density of the interface state is calculated based on the parameters about the equivalent reactance element of the interface state corresponding to the fitted frequency function curve group, and the depth of the energy level of the interface state is calculated based on the parameters about the equivalent resistive element of the interface state corresponding to the fitted frequency function curve group.

6. The method according to claim 1, wherein the reactance element includes a capacitance, and the resistive element includes a resistance.

7. The method according to claim 1, wherein fitting refers to a best fit measurement to the capacitance-frequency scatter diagram and the measure conductance-frequency scatter diagram.

8. The method according to claim 1, wherein the step of acquiring the measured capacitance $C_d$ of the dielectric layer and the measured capacitance $C_b$ of the barrier layer comprises:

obtaining a C-V curve of the integral capacitance of the MIS-HEMT device varying with different gate voltages; and calculating based on the capacitance corresponding to a first step and a second step of the C-V curve to obtain the measured capacitance $C_d$ of the dielectric layer and the measured capacitance $C_b$ of the barrier layer, wherein the first step and the second step represent the positions of two steps that appear one after another in the C-V curve, respectively.

9. The analysis method according to claim 8, wherein when plotting the function curve, the resistance of the channel layer decreases as the gate voltage $V_{gs}$ increases in the region of the first step, and the resistance of the barrier layer decreases as the gate voltage $V_{gs}$ increases in the region of the second step; and according to a changing rule about the resistance of the channel layer varying with the gate voltage $V_{gs}$ and a changing rule about the resistance of the barrier layer varying with the gate voltage $V_{gs}$ corresponding to the regions of the first and second steps respectively, adjusting the assigned values of the equivalent resistance of the channel layer.

10. An apparatus for analysis of interface state of MIS-HEMT device, comprising:

a model establishing unit, configured for establishing an equivalent model of a MIS-HEMT device to be analyzed, the MIS-HEMT device including a dielectric layer, a barrier layer and a channel layer, the equivalent model including a dielectric-layer equivalent circuit representing the electrical characteristics of the dielectric layer, a barrier-layer equivalent circuit representing the electrical characteristics of the barrier layer, a channel-layer equivalent circuit representing the electrical characteristics of the channel layer and an interface-state equivalent circuit representing the electrical characteristics of the interface state between the dielectric layer and the barrier layer, the dielectric-layer equivalent circuit, the barrier-layer equivalent circuit and the channel-layer equivalent circuit being connected in series, the interface-state equivalent circuit being connected in parallel to the barrier-layer equivalent circuit, or the interface-state equivalent circuit being connected in parallel to a circuit in which the barrier-layer equivalent circuit is connected in series with the channel-layer equivalent circuit, the dielectric-layer equivalent circuit at least including a reactance element, the barrier-layer equivalent circuit including a reactance element and a resistive element that are connected in parallel, and the channel-layer equivalent circuit including a reactance element and a resistive element that are connected in series;

an acquiring unit, configured for acquiring a measured capacitance $C_d$ of the dielectric layer and a measured capacitance $C_b$ of the barrier layer, and taking the capacitance $C_d$ and the capacitance $C_b$ as a parameter about the equivalent reactance element of the dielectric layer and a parameter about the equivalent reactance element of the barrier layer respectively;

a measuring unit, configured for measuring an integral capacitance and an integral conductance of the MIS-HEMT device at a preset gate voltage and changing frequencies, and plotting measured data in a capacitance-frequency diagram and a conductance-frequency diagram to form a measured capacitance-frequency scatter diagram and a measured conductance-frequency scatter diagram;

a plotting unit, configured for plotting a function curve, assigning a group of values to the parameters about the equivalent resistive element of the barrier layer, the equivalent reactance element of the channel layer, the equivalent resistive element of the channel layer and the interface-state equivalent circuit, substituting the group of assigned values and the capacitance $C_d$ and $C_b$ into the equivalent model to obtain a group of a capacitance-frequency function curve and a conductance-frequency function curve corresponding to the group of assigned values; repeating the step of plotting the function curve to obtain several groups of capacitance-frequency function curves and conductance-frequency function curves;

comparing the obtained several groups of capacitance-frequency function curves and conductance-frequency function curves in groups with the measured capacitance-frequency scatter diagram and the measured conductance-frequency scatter diagram respectively, screening out a group of a capacitance-frequency function curve and a conductance-frequency function curve that are able to fit the capacitance-frequency scatter diagram and the measured conductance-frequency scatter diagram, and taking such group as a fitted function curve group; and a computing unit, configured for calculating a parameter about the interface state of the MIS-HEMT device according to the group of assigned values corresponding to the fitted frequency function curve group.

* * * * *